（12）United States Patent
Turek et al.

(10) Patent No.: US 7,144,320 B2
(45) Date of Patent: Dec. 5, 2006

(54) AIR DISTRIBUTION ARRANGEMENT FOR RACK-MOUNTED EQUIPMENT

(76) Inventors: James R. Turek, 930 Dighton La., Schaumburg, IL (US) 60173; Jeff A. Sode, 625 Lake Shore Blvd., Wauconda, IL (US) 60084; Christopher J. Williams, 173 Craighurst Avenue, Toronto, Ontario (CA) M4R 1K1

( * ) Notice: Subject to any disclaimer, the term of this patent is extended or adjusted under 35 U.S.C. 154(b) by 0 days.

(21) Appl. No.: 11/025,461

(22) Filed: Dec. 29, 2004

(65) Prior Publication Data
US 2006/0141921 A1 Jun. 29, 2006

(51) Int. Cl.
*H05K 5/00* (2006.01)
(52) U.S. Cl. ............................... 454/184; 361/695
(58) Field of Classification Search ............... 454/184, 454/185, 195; 312/236; 361/385, 695
See application file for complete search history.

(56) References Cited
U.S. PATENT DOCUMENTS

| 3,120,166 | A | * | 2/1964 | Lyman | ................... | 454/307 |
|---|---|---|---|---|---|---|
| 3,677,289 | A | * | 7/1972 | Rivers et al. | ............... | 137/527.8 |
| 5,428,503 | A | * | 6/1995 | Matsushima et al. | ........ | 361/695 |
| 6,462,944 | B1 | * | 10/2002 | Lin | .............................. | 361/687 |
| 6,589,308 | B1 | * | 7/2003 | Gianelo | ....................... | 55/385.6 |
| 6,616,524 | B1 | * | 9/2003 | Storck et al. | ................ | 454/184 |

* cited by examiner

Primary Examiner—Derek S. Boles
(74) Attorney, Agent, or Firm—Olson & Hierl, Ltd.

(57) ABSTRACT

An air distribution arrangement is adapted to be arranged in a cabinet for housing rack-mounted equipment that generates heat in use. The arrangement can be part of the cabinet when constructed or it can be an add-on feature. The arrangement includes plenum structure comprising side walls and a top wall that cooperates with the front door of the cabinet and the faces of the rack-mounted equipment to define a plenum. An air box in the cabinet draws ambient air from adjacent the floor into the plenum at a rate of at least 850 cfm. The ambient air is cooler than the air in the cabinet. The faces of the rack-mounted equipment have openings for receiving the ambient air to cool the interiors thereof. After cooling the rack-mounted equipment the air can be exhausted back to the ambient. The side walls and the top wall of the arrangement are adjustable to permit adjustment of the depth of the plenum. Pressure in the plenum can be relieved by slots in the plenum structure.

19 Claims, 6 Drawing Sheets

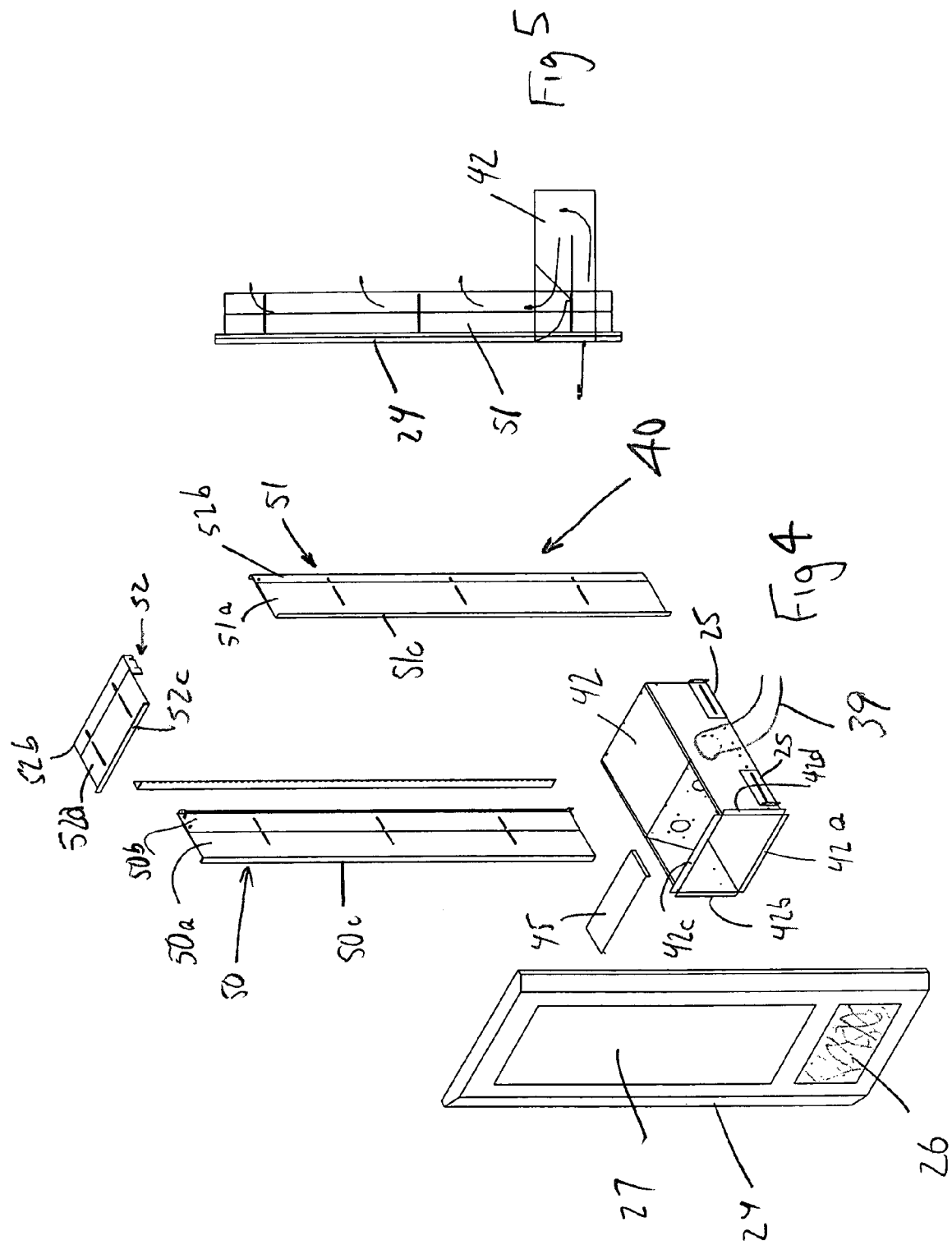

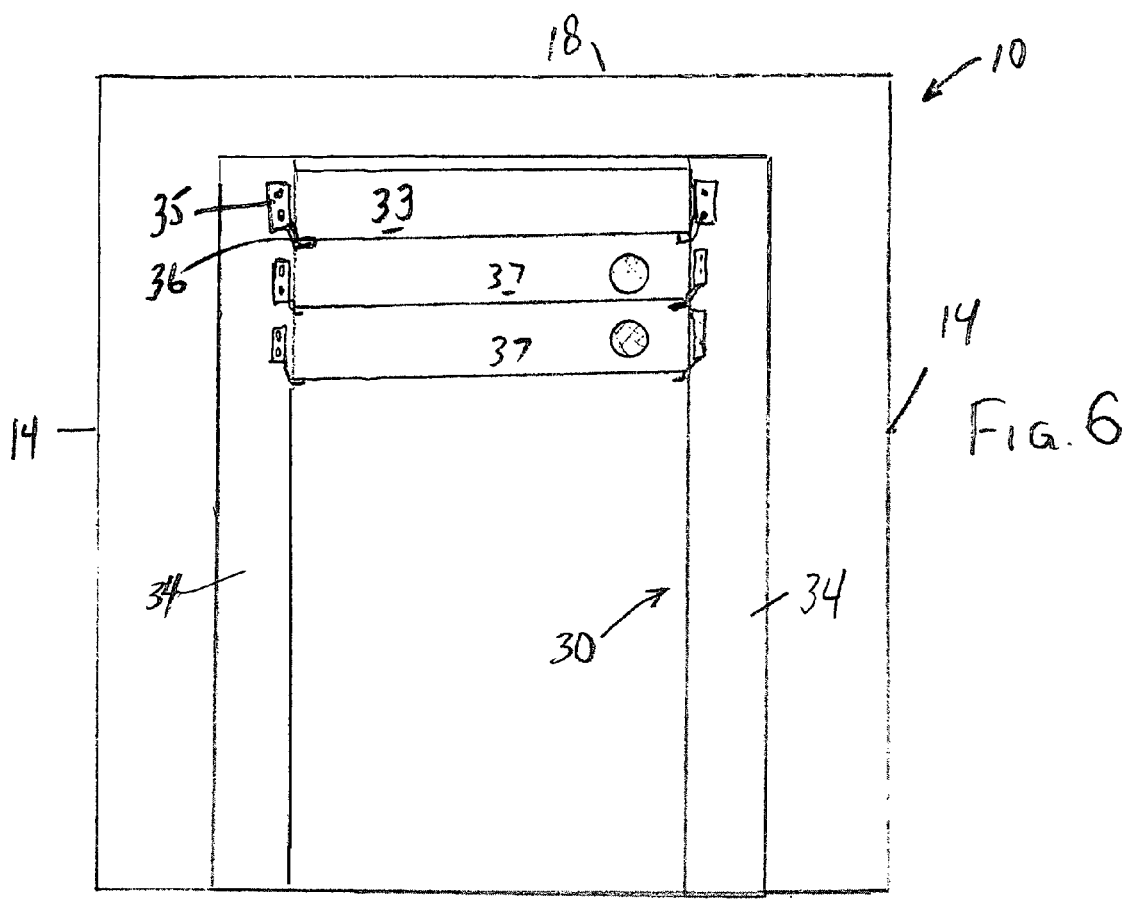
FIG. 6
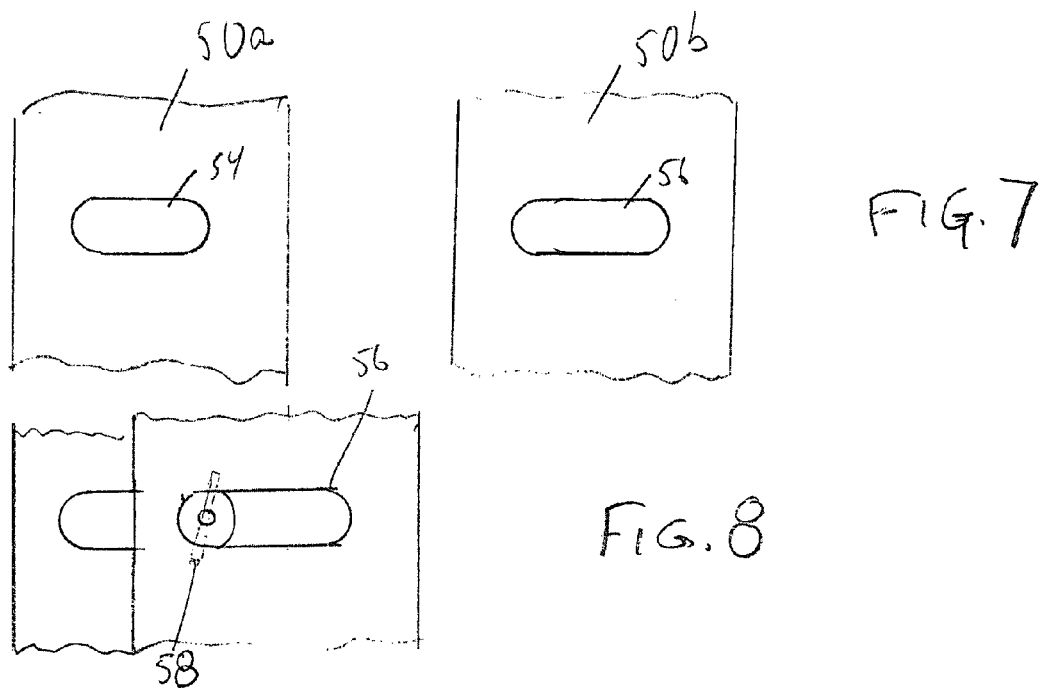
FIG. 7
FIG. 8

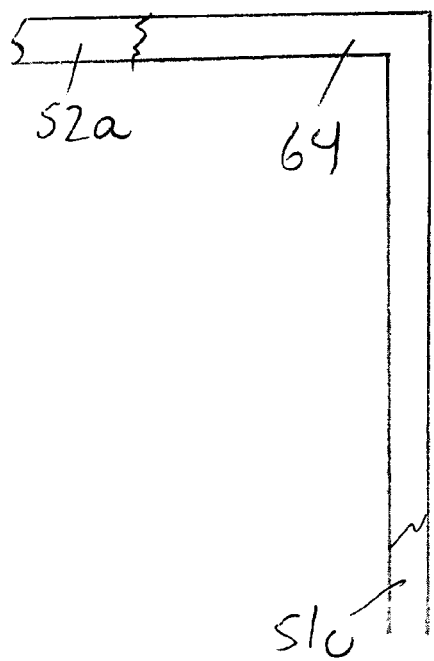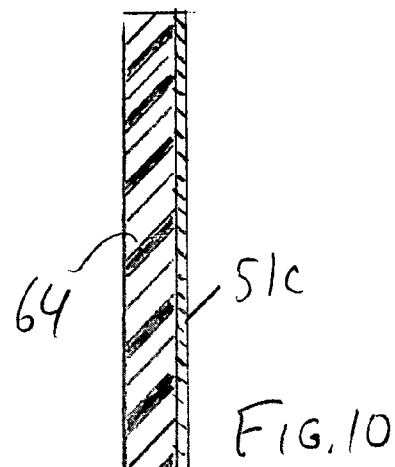

_US 7,144,320 B2_

AIR DISTRIBUTION ARRANGEMENT FOR RACK-MOUNTED EQUIPMENT

TECHNICAL FIELD

This invention pertains to an air distribution arrangement for rack-mounted computer and data storage equipment. More particularly, this invention pertains to an air distribution arrangement for rack-mounted equipment that generates heat in a cabinet within which the computer and data storage equipment is stored, which will supply cooling air only to the fronts of the computer and data storage equipment at predetermined volume and pressure for effectively cooling the rack-mounted equipment at relatively low cost.

BACKGROUND OF THE INVENTION

Cabinets for supporting rack-mounted equipment are well-known. Generally, the cabinets comprise an enclosure containing a rack that has a plurality of spaced rails at each side upon which the equipment can be supported in a vertical stack. The front of the cabinet is generally closed by at least one door.

Heat build-up within the cabinet from the computer and data storage equipment is a long standing problem, for the heat can cause failure of the computer and data storage equipment housed within the cabinet. Additionally, there can result a thermal rise or thermal gradient on the order of 15° F. to 18° F. between the bottom and the top of the cabinet. Computers and data storage equipment in the upper portion of the cabinets are more susceptible to damage, since heat rises, however, when a large amount of heat is present within the cabinet, computer and data storage in the lower portion of the cabinet can fail as well.

Arrangements for addressing the problem have included providing a fan in the cabinet for drawing air from beneath the floor, passing it over the computer and data storage equipment and discharging the air into the room. See U.S. Pat. No. 3,903,404 to Beall et al. Cabinets have been provided with fans to draw in room air and pass same in a generally upright path of travel to cool upright computer components. The air can be discharged to the ambient through a vent in the top wall of the cabinet. See, for example, U.S. Pat. No. 6,801,428 to Smith et al.

There exists a need for a low cost air distribution arrangement for rack-mounted equipment in a cabinet that provides cool ambient air to a surface of the computer and data storage equipment for effectively cooling same.

SUMMARY OF THE INVENTION

An object of the present invention is to provide an improved air distribution arrangement for a cabinet that contains rack-mounted equipment that generates heat in use.

Another object of the present invention is to provide an air distribution arrangement for a cabinet that contains rack-mounted equipment that generates heat with a plenum structure that can be used in a wide variety of industry cabinets.

A further object of this invention is to provide an air distribution arrangement for cooling rack-mounted equipment in the cabinet that includes an air box that draws in ambient air from adjacent the floor and discharges it into the plenum between the door and the rack-mounted equipment at a rate of at least 850 cfm for supplying air to the faces of the rack-mounted equipment for cooling the interiors thereof.

Yet another object of this invention is to provide a cabinet for rack-mounted equipment with an air distribution arrangement that includes plenum structure that is adjustable to accommodate a variety of industry cabinets.

Still another object of the present invention is to provide a cabinet for rack-mounted equipment that generates heat with an air distribution arrangement that includes an air box for receiving ambient air as well as cooled air from a cooling source, such as an air conditioning unit or a cold air duct in a building.

Other objects and advantages of the present invention will be made more apparent hereinafter.

By reason of the present invention that utilizes an air distribution arrangement including a defined plenum between the cabinet door and the rack-mounted equipment, ambient air can be supplied to the rack-mounted equipment that generates heat in the cabinet for normalizing the intake temperature, thus supplying uniform temperature air throughout the range of the plenum, that is, from bottom to top.

The air distribution of the present invention is adapted to be arranged in a cabinet for housing rack-mounted equipment, such as computers or servers, that generate heat in use. The air distribution can be part of a cabinet when constructed or it can be an add-on feature to an existing cabinet. The air distribution arrangement includes plenum structure comprising side walls and a top wall and an air box which cooperates with the front door of the cabinet and the faces of the rack-mounted equipment to define a plenum. A gasket seal is provided between the front door and the plenum structure to minimize the loss of pressurized air from the plenum. The air box contains one or more fans to draw ambient air from adjacent the floor into the air box and move it to the plenum at a rate of at least 850 cfm. The faces of the rack-mounted equipment have opening for receiving air from the plenum to cool the interiors thereof. After cooling the rack-mounted equipment the air can be exhausted back to the ambient.

The side walls and the top wall of the plenum structure are preferably comprised of complementary sections that are adjustable with respect to one another to vary the depth of the plenum. Suitable fasteners, such as a caged nut and bolt, are provided to secure the complementary sections in adjusted position.

Excess pressure in the plenum can be relieved by pressure relief means in at least one wall defining the plenum. The pressure relief means may comprise at least one opening in a side wall defining the plenum.

BRIEF DESCRIPTION OF THE DRAWING

There is shown in the attached drawing a presently preferred embodiment of the present invention wherein like numerals in the various views refer to like element and wherein:

FIG. 4 is an exploded perspective view of the air distribution arrangement of the present invention;

FIG. 5 is a side view of the air distribution arrangement illustrating the flow of air into and out of the plenum;

FIG. 6 is a front view illustrating a computer device in one position on the rack and a blanking panel covering an adjacent position;

FIG. 7 is a detail view illustrating a pair of complementary sections of the plenum structure prior to connection of the complementary sections;

FIG. 8 is a detail view illustrating the connection of the complementary sections of the plenum structure;

FIG. 9 is a detail section of a portion of the rack with a gasket thereon; and

FIG. 10 is a cross section taken generally along the line 10—10 of FIG. 9.

DETAILED DESCRIPTION OF THE PRESENT INVENTION

Figure 1:
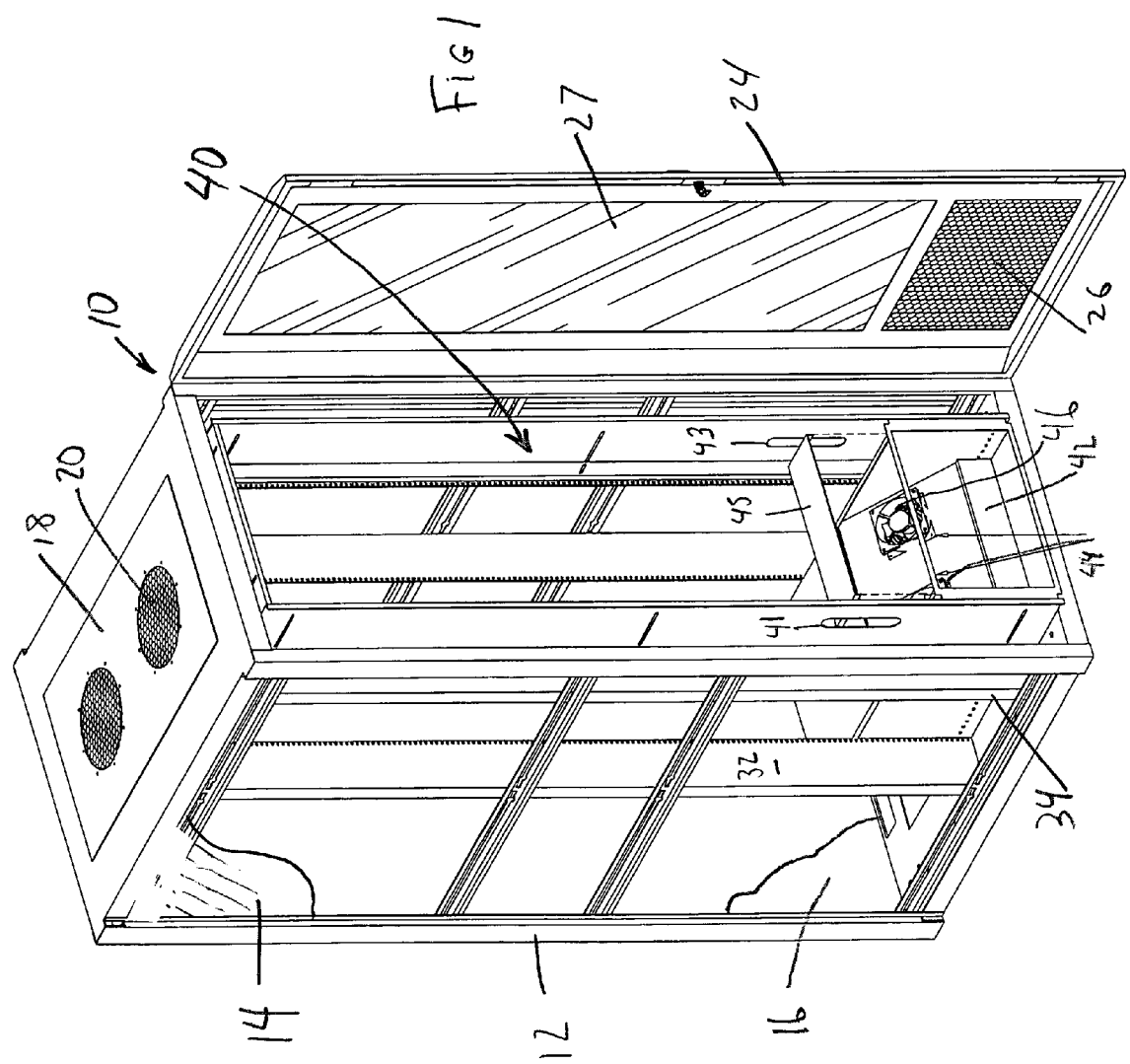
FIG. 1 is a perspective view of a cabinet fitted with the air distribution arrangement of the present invention.

There is shown in the drawing a cabinet for containing rack-mounting equipment that generates heat and the air distribution arrangement of the present invention which supplies cooling air to the rack-mounted equipment in an inexpensive and effective manner. The cabinet 10 may comprise framework 12 for supporting side walls 14, a rear door 16, and a top wall 18 with vent opening 20. A door 24 is constructed and arranged to be secured to the framework 12 for closing the front of the cabinet. The door 24 includes a mesh grille 26 to permit air to enter the cabinet 10 from the lower front thereof. The upper portion 27 of the door 24 is preferably a solid anti-static acrylic.

Disposed within the cabinet 10 is a rack 30 comprising spaced apart vertical supports 32, 34 supporting rails 36 upon which the rack-mounted equipment 37 may be supported. As seen in FIG. 1, the rack 30 is spaced at the sides from the cabinet 10 approximately the width of the vertical supports 32, 34.

The air distribution arrangement 40 of the present invention as best seen in FIGS. 1, 2, 4, and 5 includes an air box 42 constructed and arranged in the bottom of the cabinet 10 and adapted to communicate with the ambient through the grille 26 in the door 24. The air box 42 has on its sides brackets 25 for securing the air box 42 to the vertical supports 32,34 by suitable fastening means, such as a caged nut an bolt, as typically used in the industry. Disposed in the air box 42 are suitable fan means 44, 46, for example, a pair of axial fans. It will be understood by persons skilled in the art that other fans may be employed, provided they are capable of providing the air quantities and pressure necessary for a specific application. The air distribution arrangement 40 includes plenum structure for providing a plenum between the rack 30 and the door 24. The plenum structure includes side panels 50,51 and the top panel 52 operatively connected to one another. Preferably, the side panels 50,51 and the top panels 52 comprise complementary sections 50 a,b, 51 a,b, and 52 a,b which are adjustable with respect to one another to adjust the depth of the plenum.

As seen in FIG. 6, brackets 35 are secured to the vertical supports 34 for supporting rails 36. The brackets 35 are secured to the vertical supports by suitable fasteners, such as, caged nuts and bolts. The computer devices 37 can be carried on the rails 36, which can be appropriately spaced from one another on the vertical supports, depending upon the spacing needed between adjacent stacked computer devices 37. In the event a computer device 37 is removed from the rack, a blanking panel 33 can be put in place to prevent air from the plenum passing into the cabinet through the opening left by removal of the computer device 37.

The complementary sections 50a and 50b each include slots 54 and 56 respectively (FIG. 7). To connect the complementary sections 50a and 50b, the slots 54 and 56 are overlapped, as shown in FIG. 8. Instead of slots 54 and 56, a plurality of aligned round or square openings could be provided in the complementary sections 50a and 50b. A bolt could be passed through a pair of aligned openings in the respective complementary sections 50a and 560b to secure them together. The structure with aligned opening would be the equivalent of the elongated openings provided by the slots 54 and 56.

Figure 2:
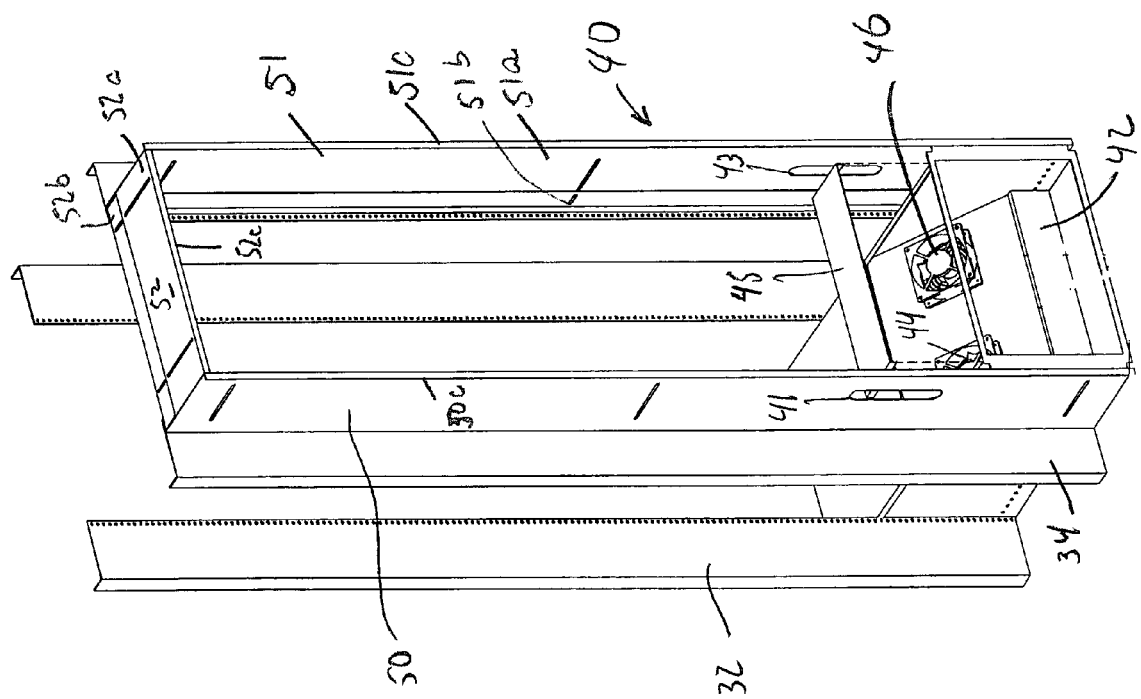
FIG. 2 is a perspective view of the air distribution arrangement of the present invention, with the cabinet removed.
Figure 3:
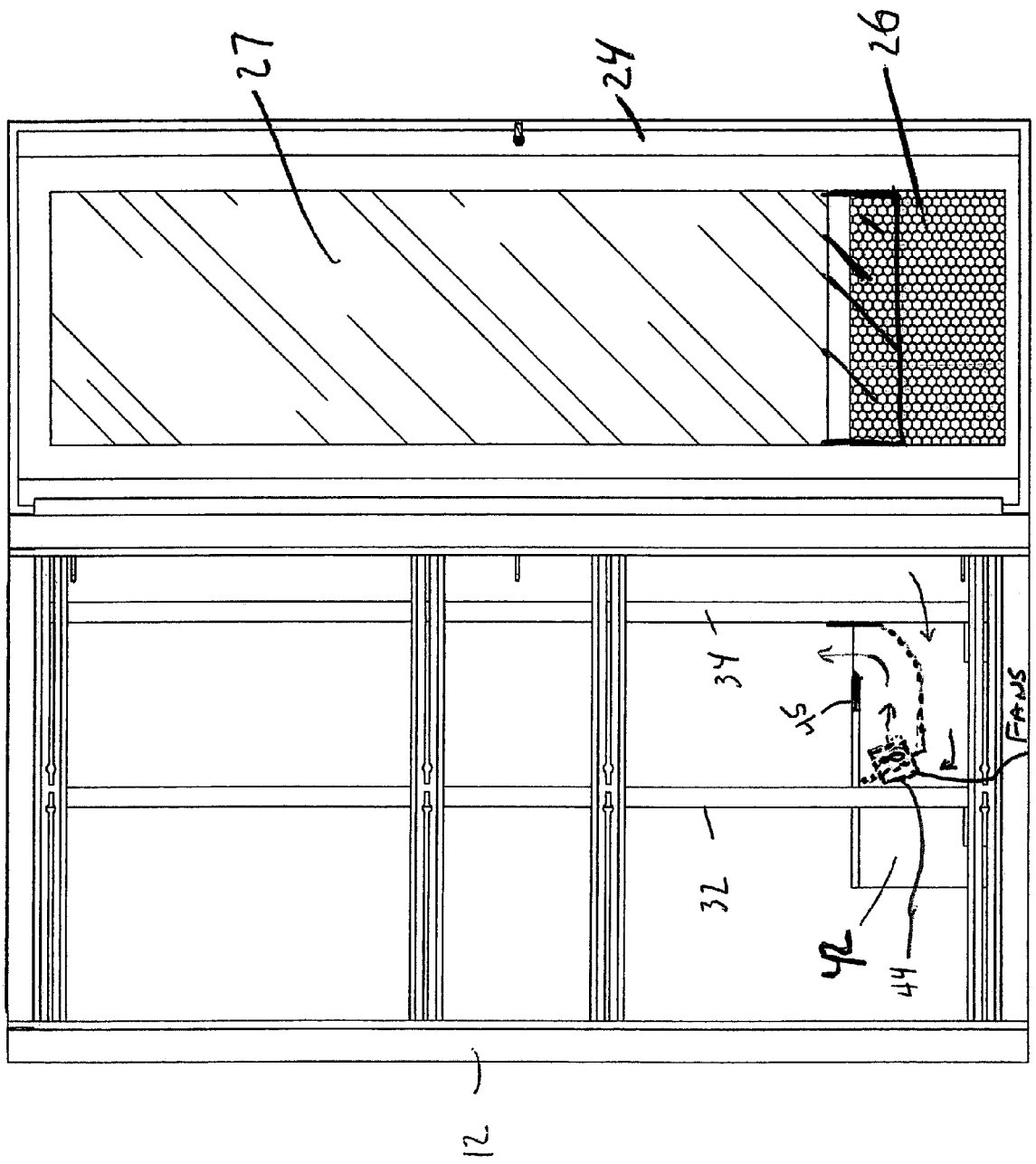
FIG. 3 is a side view of the cabinet of FIG. 1, with the door open and the side wall omitted.

As shown in FIG. 8, suitable fastening means 58 are provided to secure the complementary sections 50a, 50b in desired adjusted portion. The fastening means 58 may comprise a bolt and caged nut or like fastener. Similar fasteners are used to secure the complementary sections of the other side 51 and top 52 to one another. As seen in FIG. 2, the plenum structure is bolted or otherwise secured to the vertical supports 34 by like fasteners.

Turning to FIGS. 9 and 10 there is shown a portion of the plenum structure with a seal means or gasket 64 affixed thereon. The gasket 64 may be made from a suitable resilient material, such as polyurethane, which is suitably bonded or secured to the plenum structure. The gasket 64 may be bonded to the flanges 42a, 42 b, 42c, and 42 d on the air box 42, as well as the flange 50c on the side wall 50, the flange 52a on the top wall 52, and the flange 51c on the side wall 51 by a suitable adhesive (See FIG. 4). Alternately, the gasket 64 can be affixed to the flanges on the plenum structure by a fastener, such as a screw (not shown). The gasket 64 forms a seal between the rear of the front door 24 and the flanges on the plenum structure in the cabinet to seal the plenum from the ambient.

In operation, the fan means 44,46 are energized to draw ambient air into air box 42 through the grille 26 in the front door 24 of the cabinet 10. Panel 45 is provided in the cabinet 10 to adjust the opening of the air box 42 to the depth of the plenum formed between the faces of the rack-mounted devices 37, the door 24 and the plenum structure 50, 51, 52. The coolest ambient air, normally that adjacent the floor, is drawn into the air box and then forced into the plenum at a rate of at least 850 cfm. The cooling air will flow upwardly in the plenum and be drawn into respective computer devices 37 for cooling same from the inlet opening or openings 38 in the front faces thereof that communicates with the plenum. Excess pressure within the plenum can be relieved by pressure relief means 41,43, which may comprise slotted openings in the sides 50, 51 of the plenum structure. The air discharged from the computer devices 37 will pass into the space between the rack-mounted equipment and the interior of the cabinet and be discharged from the vent openings 20 in the top 18 of the cabinet 10 or through the rear door 16.

There has been provided by the air distribution arrangement of this invention a relatively inexpensive means for cooling rack-mounted equipment in a cabinet. A common size of cabinet used in the industry is thirty (30) inches deep by twenty four (24) inches wide by eighty four (84) inches high. The air distribution arrangement of the present invention is constructed and arranged to dissipate the heat load that might be generated within the cabinet during operation of the rack-mounted equipment. Within the industry a person of ordinary skill in the art would recognize that by adopting a 30 degree temperature differential from front to rear through the rack-mounted equipment and using fan means capable of producing 850 cfm of air in the plenum, a heat load of 8 KW can be accommodated. By maintaining a volume of at least 850 cfm, sufficient ambient air can be provided to cool such cabinet.

Similarly, if an industry standard larger cabinet were used, for example, forty eight (48) inches deep by thirty (30) inches wide by eighty four (84) inches high, a larger fan means would be needed to pressurize the plenum and provide sufficient cooling air. Air volume on the order of 2000 cfm would accommodate a heat load on the order of 19 KW in the cabinet.

As would be known to a person skilled in the art, the heat load to be removed from a cabinet can be calculated by the following formula: (cfin×TD)×0.2931=HL in watts. CFM is the cubic feet per minute of air from the fan means. TD is the temperature differential across the rack-mounted equipment, for example, computers or servers, from front to rear. The term "0.2931" is a constant.

In a modification, cooled air may be supplied to the cabinet through a duct 39 (FIG. 4) communicating a source of cooled air to the air box 42. The source of cooled air may be an air conditioning unit or a cold air conduit in the building. This arrangement will provide additional cooling capacity that may be desired or needed for some applications.

In summary, the present invention provides a cabinet for rack-mounted equipment that generates heat with a low cost air distribution arrangement for effectively cooling the rack-mounted equipment. The air distribution arrangement includes plenum structure that fits into any conventional industry cabinet and that is adjustable to vary the plenum depth. The air distribution arrangement includes an air box containing at least one fan for drawing ambient air from the room adjacent the floor and passing it to the plenum at a rate of at least 850 cfm. A resilient gasket is disposed between the front door of the cabinet and the plenum structure to minimize air loss from the plenum, thus providing a pressurized plenum. Excess pressure in the plenum can be relieved by pressure relief means in the plenum structure, for example, an opening or openings in the side walls of the plenum structure that communicates with the space between the rack-mounted equipment and the cabinet.

While we have disclosed a presently preferred embodiment of the invention, it will be understood by persons skilled in the art that the invention may be otherwise embodied within the scope of the attached claims.

We claim:

1. An air distribution arrangement for rack-mounted equipment that generates heat, said arrangement comprising a cabinet for housing the rack-mounted equipment, the rack-mounted equipment having one or more air inlet openings, said arrangement comprising plenum structure including side panels, and a top panel, said top panel and said side panels being comprised of complementary sections that are adjustable to permit adjustment of the depth of the plenum, a door affixed to the cabinet and cooperating with the rack-mounted equipment and plenum structure to define a plenum, an air box in the cabinet communicating with the plenum and with the ambient, inlet fan means in the air box for supplying ambient air at a rate of at least 850 cfm to the plenum, whereby ambient air may be supplied to the rack-mounted equipment for cooling same only from the plenum, exhaust means for communicating with the ambient, whereby the air for cooling the rack-mounted equipment can be returned to the ambient.

2. An air distribution arrangement as in claim 1, wherein the inlet fan means is affixed to the bottom of the cabinet.

3. An air distribution arrangement as in claim 1, wherein the inlet fan means comprises a pair of axial fans.

4. An air distribution arrangement as in claim 1, wherein ambient air can reach the rack-mounted equipment only from openings in the front wall thereof.

5. An air distribution arrangement as in claim 1, wherein said plenum is a pressurized plenum.

6. An air distribution arrangement as in claim 1, wherein the plenum is defined by top and side walls extending forwardly from the rack mounted equipment.

7. An air distribution arrangement as in claim 1, including fastening means for securing the complementary sections in selected adjusted position.

8. An air distribution arrangement as in claim 1, wherein each complementary section has a slot therein, the slots being aligned to permit adjustment of one complementary section with respect to the other.

9. An air distribution arrangement as in claim 1 including seal means disposed between the door and the plenum structure for sealing the plenum.

10. An air distribution arrangement as in claim 9, wherein the seal means comprises a resilient gasket.

11. An air distribution arrangement as in claim 9 wherein pressure relief means are provided in at least one side wall defining the plenum.

12. An air distribution arrangement as in claim 11, wherein the pressure relief means comprises at least one opening in a side wall defining the plenum.

13. An air distribution arrangement for a cabinet containing rack-mounted equipment that generates heat, the rack-mounted equipment having one or more air inlet openings, said arrangement comprising plenum structure including side panels, and a top panel, said top panel and said side panels being comprised of complementary sections that are adjustable to permit adjustment of the depth of the plenum, a door adapted to be affixed to the cabinet and adapted to cooperate with the rack-mounted equipment and plenum structure to define a plenum, an air box adapted to communicate with the plenum and with a source of air, inlet fan means in the air box for supplying air at a rate of at least 850 cfm to the plenum, whereby air may be supplied to the rack-mounted equipment for cooling same only from the plenum, exhaust means for communicating with an outlet, whereby the air for cooling the rack-mounted equipment can be returned to the outlet.

14. An air distribution arrangement as in claim 13, wherein the outlet communicates with the source of air, whereby the air for cooling the rack-mounted equipment can be returned to the source of air.

15. The air distribution arrangement as in claim 13, wherein said complementary sections each include openings, an opening in one complementary section being aligned with a selected opening in the other complementary section to adjust the complementary sections with respect to one another.

16. The air distribution arrangement as in claim 15, wherein the openings are slots.

17. The air distribution arrangement as in claim 15, including fastening means for securing the complementary sections in selected adjusted position.

18. An air distribution arrangement for rack-mounted equipment that generates heat, said arrangement comprising a cabinet for housing the rack-mounted equipment, the rack-mounted equipment having one or more air inlet openings, said arrangement comprising plenum structure including side panels, and a top panel, a door affixed to the cabinet and cooperating with the rack-mounted equipment and plenum structure to define a plenum, said top panel and said side panels being comprised of complementary sections that are adjustable to permit adjustment of the depth of the plenum, an air box in the cabinet communicating with the plenum and with a source of air, inlet fan means in the air box for supplying air at a rate of at least 850 cfm to the plenum, whereby air may be supplied to the rack-mounted equipment for cooling same only from the plenum, exhaust means for communicating with the source of air, whereby the air for cooling the rack-mounted equipment can be returned to the source of air.

19. For use with a cabinet for housing rack-mounted equipment that generates heat, the rack-mounted equipment having one or more air inlet openings, and a door cooperating with the cabinet, the improvement being an air distribution arrangement comprising plenum structure including side panels, and a top panel adapted to be secured to the cabinet, said door being adapted to be affixed to the plenum structure and cooperating with the rack-mounted equipment for defining a plenum, said top panel and said side panels being comprised of complementary sections that are adjustable to permit adjustment of the depth of the plenum, an air box adapted to be positioned in the cabinet for communicating with the plenum and with a source of air, inlet fan means in the air box for supplying air at a rate of at least 850 cfm to the plenum, whereby air may be supplied to the rack-mounted equipment for cooling same only from the plenum, and exhaust means for communicating with the source of air, whereby the air for cooling the rack-mounted equipment can be returned to the source of air.

\* \* \* \* \*

UNITED STATES PATENT AND TRADEMARK OFFICE
CERTIFICATE OF CORRECTION

PATENT NO. : 7,144,320 B2  
APPLICATION NO. : 11/025461  
DATED : December 5, 2006  
INVENTOR(S) : Turek et al.

Page 1 of 1

It is certified that error appears in the above-identified patent and that said Letters Patent is hereby corrected as shown below:

col. 5, line 10, change "(cfinxTD)" to -- "(cfm x TD)" --

Signed and Sealed this

Eighth Day of April, 2008

JON W. DUDAS  
*Director of the United States Patent and Trademark Office*